United States Patent
Maher et al.

(10) Patent No.: US 12,286,964 B2
(45) Date of Patent: Apr. 29, 2025

(54) DEVICES AND METHODS FOR HARVESTING KINETIC ENERGY

(71) Applicant: Voltai Inc., Dartmouth (CA)

(72) Inventors: Maja Celine Maher, Dartmouth (CA); Moustafa Maher, Dartmouth (CA); Ahmed Maher, Dartmouth (CA)

(73) Assignee: Voltai Inc., Dartmouth (CA)

(*) Notice: Subject to any disclaimer, the term of this patent is extended or adjusted under 35 U.S.C. 154(b) by 0 days.

(21) Appl. No.: 18/584,726

(22) Filed: Feb. 22, 2024

(65) Prior Publication Data

US 2024/0191705 A1 Jun. 13, 2024

Related U.S. Application Data

(63) Continuation of application No. PCT/CA2023/050830, filed on Jun. 15, 2023.
(Continued)

(30) Foreign Application Priority Data

Feb. 27, 2023 (CA) .............................. CA 3191249

(51) Int. Cl.
*H02N 2/18* (2006.01)
*F03G 7/08* (2006.01)

(52) U.S. Cl.
CPC .............. *F03G 7/08* (2013.01); *H02N 2/186* (2013.01); *B63B 2209/14* (2013.01)

(58) Field of Classification Search
CPC .... H10N 30/30; H10N 30/302; H10N 30/304; H10N 30/306; H10N 30/308
(Continued)

(56) References Cited

U.S. PATENT DOCUMENTS 7,538,445 B2 5/2009 Kornbluh et al.
7,839,058 B1* 11/2010 Churchill ............. H10N 30/304
310/332
(Continued)

FOREIGN PATENT DOCUMENTS

CN 10448583 A 4/2015
JP 2016121758 A 7/2016
(Continued)

OTHER PUBLICATIONS

International Search Report and Written Opinion dated Aug. 17, 2023 issued in the corresponding PCT International Application No. PCT/CA2023/050830.
(Continued)

*Primary Examiner* — Derek J Rosenau
(74) *Attorney, Agent, or Firm* — Stephen Beney; SMART & BIGGAR LP

(57) ABSTRACT

Devices and methods are provided for harvesting kinetic energy. The devices can include a plurality of dielectric elastomeric membranes, a rigid connector rod, and a mountable support base. Membrane layers have a funnel-shape with a narrow opening portion and a wide perimeter portion. Membrane layers are adjacent to other membrane layers having an opposite orientation defined by the narrow opening portion and the wide perimeter portion. The narrow opening portions are coupled to a first end portion of the connector rod. The wide perimeter portions are fixed in relation to the support base. Application of linear force at a second end portion of the connector rod in a first direction causes at least a first membrane layer to stretch. Application of the force in a second direction opposite to the first direction causes at least a second membrane layer adjacent to the first membrane layer to stretch.

18 Claims, 9 Drawing Sheets

Related U.S. Application Data

(60) Provisional application No. 63/352,567, filed on Jun. 15, 2022.

(58) Field of Classification Search
USPC .......................................................... 310/339
See application file for complete search history.

(56) References Cited

U.S. PATENT DOCUMENTS

| | | |
|---|---|---|
| 8,987,928 B2 | 3/2015 | Jean |
| 10,804,038 B2 | 10/2020 | O'Brien et al. |
| 11,081,976 B2 | 8/2021 | Chiba et al. |
| 2004/0217671 A1* | 11/2004 | Rosenthal ............ A61M 5/142 310/328 |
| 2008/0157631 A1* | 7/2008 | Heim ...................... G06F 3/016 310/330 |
| 2021/0384408 A1 | 12/2021 | Chiba et al. |

FOREIGN PATENT DOCUMENTS

| | | |
|---|---|---|
| JP | 6937099 B2 | 9/2021 |
| WO | 2010111376 A1 | 9/2010 |

OTHER PUBLICATIONS

"A Review of Dielectric Elastomer Generator Systems", Moretti et al., www.advintellsyst.com, Adv. Intell. Syst. 2020, 2, 2000125, 2020 The Authors, Published by Wiley-VCH GmbH, pp. 1-30, downloaded from https://onlinelibrary.wiley.com/doi/10.1002/aisy.202000125 by Cochrane Canada Provision, Wiley Online Library on [Jan. 14, 2023].

* cited by examiner

DEVICES AND METHODS FOR HARVESTING KINETIC ENERGY

CROSS-REFERENCE TO RELATED APPLICATIONS

This application is a continuation of PCT application No. PCT/CA2023/050830, filed on Jun. 15, 2023, which claims the benefit of Canadian Patent Application No. 3,191,249 filed on Feb. 27, 2023, which claims the benefit of U.S. Provisional Patent Application No. 63/352,567 filed on Jun. 15, 2022. The entire contents of each of PCT Application No. PCT/CA2023/050830, Canadian Patent Application No. 3,191,249 and U.S. Provisional Patent Application No. 63/352,567 are hereby incorporated by reference for all purposes.

FIELD

The described embodiments relate to devices and methods for harvesting kinetic energy. In some example embodiments, the devices and methods can relate dielectric elastomeric generators.

BACKGROUND

Transportation energy is often a balance between physical space and energy capacity. Additional energy capacity can be gained by storing energy in the form of fuel or batteries. However, fossil fuel-based energy sources cause carbon dioxide emissions, which are harmful for the environment. Many electrified transportation methods are limited by battery size and weight as well as high requirements for port charging infrastructure.

Alternatively, energy can be harvested from the environment surrounding the application, such as wind or solar power. Solar power is a common energy harvesting technology used by marine vessels and platforms. However, solar energy systems require a lot of surface area, and the output is limited by the availability of the sun.

The ocean holds tremendous power in the form of waves that is normally unused. Wave energy is available 365 days and nights per year, irrespective of the availability of the sun. In addition, there is often greater waves when there is less sun. As such, wave energy can be complementary to solar energy systems. Furthermore, waves can wreak havoc on marine vessels.

Conventional technologies used for wave harvesting are not practical because they are based on electromagnetic turbines. Electromagnetic turbines are too heavy and bulky to be a practical and cost-efficient energy harvesting system for marine vessels. Current wave harvesting technologies are also limited to harvesting rotational accelerations. However, accelerations caused by waves are linear in nature and additional inefficiencies result from the conversion of linear to rotational acceleration.

The marine sector is one example, but this challenge of on-board energy supply exists is other industries as well, including but not limited to land-based transportation, unmanned surface vehicles, sensor platforms, wearable devices, and medical devices.

SUMMARY

The various embodiments described herein generally relate to devices (and associated methods) for harvesting kinetic energy. A device can include a plurality of dielectric elastomer membrane layers arranged in a stack having a first end and a second end, a rigid connector rod having a longitudinal axis and extending from a first end portion to a second end portion, and a mountable support base facing the second end of the stack. Each membrane layer can be funnel-shaped with a narrow opening portion and a wide perimeter portion. Each membrane layer can be adjacent to another membrane layer having an opposite orientation defined by the narrow opening portion and the wide perimeter portion. Each membrane layer can be configured to accumulate electrical charge when cyclically stretched and relaxed. The narrow opening portions of the membrane layer can be coupled to the first end portion of the connector rod. The second end portion of the connector rod can extend out from the first end of the stack. The wide perimeter portions of the membrane layer can be fixed in relation to the support base. Application of linear force at the second end portion of the connector rod in a first direction along the longitudinal axis causes at least a first membrane layer to stretch. Application of the force in a second direction opposite to the first direction causes at least a second membrane layer adjacent to the first membrane layer to stretch.

In some embodiments, each membrane layer can include a plurality of elongated membrane elements. Each elongated membrane element of the plurality of elongated membrane elements can extend between the narrow opening portion of that membrane layer and the wide perimeter portion of that membrane layer.

In some embodiments, each elongated membrane element can include a rolled stack. The rolled stack can include at least two electrodes and a dielectric element between the two electrodes.

In some embodiments, the rolled stack can include a first dielectric element, a first electrode adjacent the first dielectric element, a second dielectric element adjacent the first electrode, and a second electrode adjacent the second dielectric element.

In some embodiments, each membrane layer can include at least one conical membrane element, each conical membrane element can include a pair of outer insulating elements, a pair of electrodes between the pair of outer insulating elements, and a dielectric element between the pair of electrodes.

In some embodiments, the at least one conical membrane element can consist of a pair of outer insulating elements, a pair of electrodes between the pair of outer insulating elements, a pair of dielectric elements between the pair of electrodes, and a single electrode between the pair of dielectric elements. A first dielectric transducer can be formed by a first electrode of the pair of electrodes, a first dielectric element of the pair of the dielectric elements, and the single electrode, and a second dielectric transducer can be formed by a second electrode of the pair of electrodes, a second dielectric element of the pair of the dielectric elements, and the single electrode.

In some embodiments, each membrane layer can include a single conical membrane element.

In some embodiments, one or more of the outer insulating elements and the dielectric element can include a dielectric film.

In some embodiments, the dielectric film can include one or more of a silicone and a natural rubber latex.

In some embodiments, each of the electrodes can be stretchable.

In some embodiments, the device can further include an electrical energy storage component. The electrical energy storage component can receive at least a portion of the electrical charge accumulated by the first membrane layer when force in the second direction is applied and at least a portion of the electrical charge accumulated by the second membrane layer when force in the first direction is applied.

In some embodiments, the device can further include a fastener attachable to the second end portion of the connector rod for coupling the second end portion to a physical load.

In some embodiments, the first end portion of the connector rod can pass through the narrow opening portions of each membrane layer of the plurality of membrane layers.

In some embodiments, the plurality of membrane layers can include an upper-most membrane layer and a lower-most membrane layer. The connector rod can extend out from the upper-most membrane layer. The mountable support base can face the lower-most membrane layer.

In some embodiments, the upper-most membrane layer can be oriented with the wide perimeter portion upwards.

In some embodiments, the upper-most membrane layer can be oriented with the wide perimeter portion downwards.

In some embodiments, the lower-most membrane layer can be oriented with the wide perimeter portion upwards.

In some embodiments, the lower-most membrane layer can be oriented with the wide perimeter portion downwards.

In some embodiments, the funnel-shape can be a round funnel-shape.

In some embodiments, the narrow opening portion can be concentric with the wide perimeter portion for each membrane layer.

In some embodiments, the device can further include a rigid frame for maintain the wide perimeter portions of the membrane layers in fixed relation to the support base.

In some embodiments, the device can further include one or more plates connecting adjacent membrane layers of the plurality of membrane layers.

In some embodiments, the one or more plates connect the narrow opening portions of adjacent membrane layers of the plurality of membrane layers.

In some embodiments, the device can further include a cover portion for enclosing the plurality of membrane layers. The cover portion can have a hole there through for passage of the second end portion of the connector rod. The cover portion can be fixable to the mountable support base.

In some embodiments, the cover portion can include inner engaging surfaces having a shape complementary to a shape of surfaces of the wide perimeter portions of the membrane layers.

In some embodiments, the mountable support base can include engaging surfaces having a shape complementary to surfaces of the cover portion.

In some embodiments, the mountable support base can define one or more holes.

In another broad aspect, a method of manufacturing a kinetic energy harvesting device is disclosed. The method can involve forming a plurality of dielectric elastomer membrane elements. Each dielectric elastomer membrane element can be configured to accumulate electrical charge when cyclically stretched and relaxed. The method can further involve using the plurality of membrane elements to form a plurality of funnel-shaped membrane layers and arranging the plurality of membrane layers in a stack. Each membrane layer can be funnel-shaped with a narrow opening portion and a wide perimeter portion. Each membrane layer can be arranged adjacent to another membrane layer having an opposite orientation defined by the narrow opening and the wide perimeter portion. The method can further involve inserting a first end portion of a rigid connector rod through the narrow opening portions of the membrane layers of the stack; coupling the narrow opening portions of the membrane layers of the stack to the first end portion of the connector rod; and fixing the wide perimeter portions of the membrane layers of the stack in relation to the mountable support base. The connector rod can have a longitudinal axis extending from the first end portion to a second end portion. The second end portion of the connector rod can extend out from the first end of the stack. Application of linear force at the second end portion of the connector rod in a first direction along the longitudinal axis causes at least a first membrane layer of the plurality of membrane layers to stretch and application of the force in a second direction opposite to the first direction causes at least a second membrane layer adjacent to the first membrane layer to stretch.

In some embodiments, forming a plurality of dielectric elastomer membrane elements can involve, for each dielectric elastomer membrane element of the plurality of dielectric elastomer membrane elements: providing at least one dielectric element, the at least one dielectric element including a first dielectric element; and for each side of the first dielectric element, applying one or more layers of liquid metal to the first dielectric element to form one or more electrodes.

In some embodiments, the one or more electrodes for at least one side of the first dielectric element can include a plurality of electrodes. The method can further involve forming at least one channel through the first dielectric element; providing a conductive element within the at least one channel of the first dielectric element to provide an electrical connection between two electrodes on opposite sides of the first dielectric element; providing at least one additional dielectric element between each pair of electrodes of the plurality of electrodes, the additional dielectric element defining at least one channel therein; and providing a conductive element within the at least one channel of the at least one additional dielectric element to provide an electrical connection between two electrodes on opposite sides of the at least one additional dielectric element.

In some embodiments, for each of a first side and a second side of the first dielectric element, the one or more electrodes can include two electrodes. The at least one channel of the first dielectric element can include a first channel and a second of the first dielectric element. The first channel can provide an electrical connection between an electrode adjacent to the first side of the first dielectric element and an electrode adjacent to the additional dielectric element between the two electrodes on the second side of the first dielectric element. The second channel can provide an electrical connection between an electrode adjacent to the second side of the first dielectric element and an electrode adjacent to the additional dielectric element between the two electrodes on the first side of the first dielectric element. The second channel can be separate from the first channel.

In some embodiments, forming at least one channel through the first dielectric element can involve cutting or stamping the first dielectric element.

In some embodiments, providing at least one additional dielectric element between each pair of electrodes of the plurality of electrodes can involve: applying a layer of liquid metal to form a first electrode of the pair of electrodes; applying a layer of dielectric film to the first electrode to provide the additional dielectric element; and applying a layer of liquid metal to the additional dielectric element to form a second electrode of the pair of electrodes.

In some embodiments, the layer of dielectric film can include a pre-cured film covered with adhesive.

In some embodiments, applying a layer of dielectric film to the first electrode can involve applying a liquid elastomer to the first electrode; and one or more of curing or vulcanizing the liquid elastomer to provide the additional dielectric element.

In some embodiments, using the plurality of dielectric elastomer membrane elements to form a plurality of funnel-shaped membrane layers can involve, for each funnel-shaped membrane layer, arranging a plurality of elongated membrane elements to extend between the narrow opening portion of that membrane layer and the wide perimeter portion of the membrane layer.

In some embodiments, each dielectric element of the at least one dielectric element can include a rectangular sheet. Forming each dielectric elastomer membrane element of the plurality of dielectric elastomer membrane elements can involve rolling the at least one dielectric element and the electrodes applied thereon into a rolled stack. The rolled stack can form an elongated membrane element of the plurality of elongated membrane elements.

In some embodiments, each dielectric elastomer membrane element can include a conical membrane element.

In some embodiments, each dielectric element of the at least one dielectric element can include a circular sheet.

In some embodiments, applying each layer of the one or more layers of liquid metal can involve applying the liquid metal to a surface of a dielectric element of the at least one dielectric element; and spreading the liquid metal across the surface of the dielectric element to form a thin film of liquid metal.

In some embodiments, spreading the liquid metal across the surface of the dielectric can involve one or more of painting or doctor blading.

In some embodiments, applying the liquid metal to a surface of a dielectric element of the at least one dielectric element can involve placing a stencil on the surface of the dielectric element, the stencil defining holes therein; applying the liquid metal to surfaces of the dielectric element exposed by the holes of the stencil to provide a patterned electrode; and removing the stencil after spreading the liquid metal.

In another broad aspect, a method of harvesting kinetic energy on a transportation vessel is disclosed. The method can involve mounting one or more dielectric elastomeric generators to the transportation vessel. Each of the one or more dielectric elastomeric generators can include a plurality of dielectric elastomer membrane layers arranged in a stack having a first end and a second end. Each membrane layer can be funnel-shaped with a narrow opening portion and a wide perimeter portion. Each membrane layer can be adjacent to another membrane layer having an opposite orientation defined by the narrow opening portion and the wide perimeter portion. The narrow opening portions of the membrane layers can be coupled to the first end portion of the connector rod. The connector rod can have a longitudinal axis and extend from a first end portion to a second end portion. The second end portion of the connector rod an extend out from the first end of the stack. The wide perimeter portions of the membrane layers can be fixed in relation to the transportation vessel proximal to the second end of the stack. The method can further involve coupling a physical load to the second end portion of the connector rod of the one or more dielectric elastomeric generators; electrically connecting the one or more dielectric elastomeric generators; pre-charging the one or more dielectric elastomeric generators; and using the one or more dielectric elastomeric generators to convert kinetic energy from motion of the physical load to electrical energy. The motion of the physical load applies a linear force to connector rods of the one or more dielectric elastomeric generators in a first direction along the longitudinal axis followed by another linear force to the connector rods of the one or more dielectric elastomeric generators in a second direction opposite to the first direction. The linear force in the first direction causes at least a first membrane layer of the one or more dielectric elastomeric generators to stretch. The linear force in the second direction causes at least a second membrane layer of the one or more dielectric elastomeric generators adjacent to the first membrane layer to stretch.

In some embodiments, the transportation vessel can be a marine vessel; and the motion of the physical load can be caused by tidal forces.

In some embodiments, the method can further involve using the electrical energy to power an electrical load.

In some embodiments, the method can further involve storing the electrical energy in an electrical energy storage component.

In some embodiments, the physical load can be vibration-sensitive equipment.

In some embodiments, the one or more dielectric elastomeric generators can be a plurality of dielectric elastomeric generators.

In some embodiments, the plurality of dielectric elastomeric generators can include at least a first dielectric elastomeric generator and a second dielectric elastomeric generator. The physical load can be suspended between a first dielectric elastomeric generator and a second dielectric elastomeric generator.

In some embodiments, the method can involve electrically connecting the plurality of dielectric elastomeric generators in parallel.

In some embodiments, the method can involve, for each dielectric elastomeric generator of the one or more dielectric elastomeric generators, electrically connecting adjacent membrane layers of the dielectric elastomeric generator in series.

BRIEF DESCRIPTION OF THE DRAWINGS

Several embodiments will now be described in detail with reference to the drawings, in which.

Figure 1A:
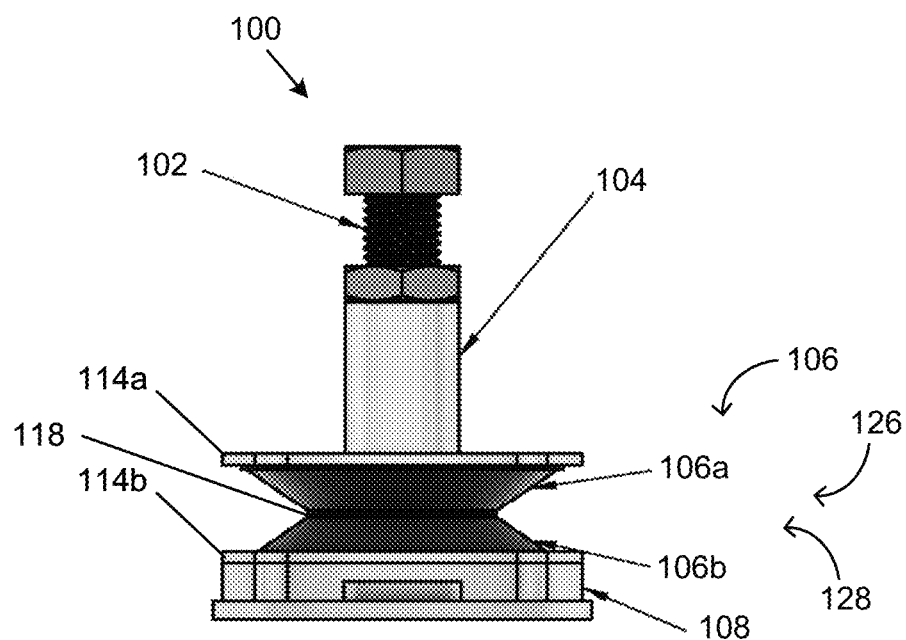
FIG. 1A is a side-view of a kinetic energy harvesting device, in accordance with an example embodiment.

The drawings, described below, are provided for purposes of illustration, and not of limitation, of the aspects and features of various examples of embodiments described herein. For simplicity and clarity of illustration, elements shown in the drawings have not necessarily been drawn to scale. The dimensions of some of the elements may be exaggerated relative to other elements for clarity. It will be appreciated that for simplicity and clarity of illustration, where considered appropriate, reference numerals may be repeated among the drawings to indicate corresponding or analogous elements or steps.

DESCRIPTION OF EXAMPLE EMBODIMENTS

The various embodiments described herein generally relate to devices (and associated method for using the devices) for harvesting kinetic energy. In particular, the devices generate electrical energy from the kinetic energy with relatively few moving parts.

Figure 1B:
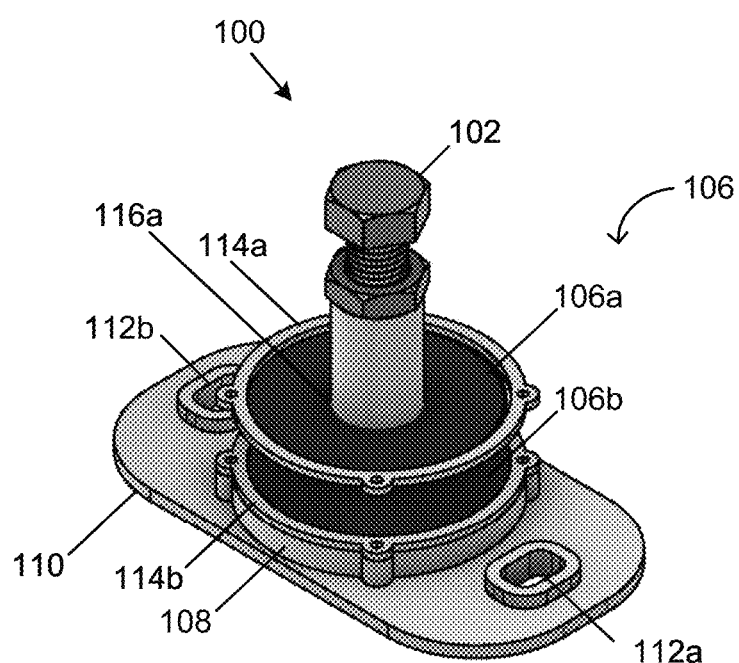
FIG. 1B is a perspective view of the device shown in FIG. 1A.

Reference now is made to FIG. 1A and FIG. 1B, which illustrate a side view and a perspective view of a kinetic energy harvesting device 100, in accordance with some embodiments. The device 100 includes a fastener 102, a connector rod 104, a plurality of membrane layers 126, 128 arranged in a stack, and a support base 108. The connector rod 104 is coupled to the plurality of membrane layers.

As shown in FIG. 1A and FIG. 1B, device 100 includes two membrane layers 126, 128 in a stack. However, device 100 can include additional membrane layers. For example, device 100 can include an additional membrane layer for a total of three membrane layers in the stack. In at least one embodiment, device 100 can include only one membrane layer 128. However, additional membrane layers can increase the maximum power output and the energy density of the device.

In some embodiments, each membrane layer 126, 128 includes at least one conical membrane element. FIG. 1A and FIG. 1B shows device 100 with each membrane layer 126, 128 having only one conical membrane element 106a and 106b respectively (herein collectively referred to as conical membrane elements 106). In other embodiments, one or more membrane layers 126, 128 can have additional membrane elements 106. Membrane elements 106 of the same membrane layer 126, 128 have the same orientation. Additional membrane elements 106 for each membrane layer 126, 128 can increase the maximum power output and the energy density of the device 100.

Each membrane element 106 includes at least one dielectric elastomeric transducer, which can be formed by a dielectric element sandwiched between a pair of electrodes. The electrodes are stretchable. The electrodes cover a large surface area of the dielectric element.

The dielectric element can be a type of electroactive polymer (EAP), which are often used in sensors and actuators. The dielectric element can be a naturally motion absorbing elastomers. In some embodiments, the dielectric element can be a thin dielectric film. A thin dielectric film can be advantageous because it can be mass produced in large sheets and can be lightweight. The dielectric film can be any type of flexible insulating film, such as but not limited to one or more of a natural rubber latex and a silicone. For example, the dielectric film can be a platinum catalyzed silicone, such as an Ecoflex™ silicone.

In some embodiments, each membrane element 106 can also include outer insulating elements to insulate the at least one transducer from the surroundings. In particular, outer insulating elements can be provided on each electrode of the at least one transducer. That is, the pair of electrodes of the transducer can be further sandwiched between a pair of outer insulating elements. In some embodiments, the outer insulating elements can also be a thin dielectric film, similar to the dielectric element of the at least one transducer.

The transducer can be similar to a large, flexible capacitor. The capacitance of the transducer (C) is a function of its geometry, as shown in Equation (1). In particular, the capacitance of the transducer can be the area A of the electrode and the thickness of the dielectric film (i.e., the distance between the electrodes).

$$C = \frac{\epsilon_0 \times \epsilon_r \times A}{d} \qquad \text{Equation (1)}$$

where: $\epsilon_0$ is the permittivity of free space (i.e., approx. $8.85 \times 10^{-12}$ F/m);

$\epsilon_r$ is the relative permittivity of the dielectric element of the transducer;

A is the area of the electrode; and d is the thickness of the dielectric element (i.e., distance between the electrodes).

When the transducer is stretched, the thickness of the dielectric element (d) decreases, and the area of the electrodes (A) increases. As a result, the capacitance of the transducer increases when the transducer is stretched. That is, the transducer accumulates electrical charge when stretched. Conversely, the capacitance of the transducer decreases when the charged transducer is relaxed (i.e., no longer stretched).

The amount of charge Q on the electrodes is a function of the capacitance of the transducer (C) and the voltage over the transducer (V), as shown in Equation (2).

$$Q = C \times V \qquad \text{Equation (2)}$$

As mentioned above, when a transducer is stretched and subsequently relaxed, the capacitance of the transducer increases and decreases. The amount of charge (Q) on the electrodes is also reduced when the transducer is relaxed. If the transducer is relaxed in an open circuit condition, the charge (Q) has nowhere to go. The charge can increase the voltage over the transducer (V), in accordance with Equation (2). This voltage can be used to power an electrical load, or it can be stored in a battery or a supercapacitor (i.e., ultracapacitor).

Returning now to FIGS. 1A and 1B, the upper membrane layer 126, that is, conical membrane element 106a, is positioned on top of the lower membrane layer 128, that is conical membrane element 106b. Thus, the upper membrane layer 126 and the lower membrane layer 128 are adjacent to one another. As shown in FIG. 1A, each membrane element 106a, 106b has a funnel-shape, or cone-shape with a narrow opening portion and a wide perimeter portion. Upper membrane layer 126, via conical membrane element 106a is oriented with the wide perimeter portion at the top and the narrow opening portion at the bottom. In contrast, lower membrane layer 128, via conical membrane element 106b is oriented with the narrow opening portion at the top and the wide perimeter portion at the bottom. That is, adjacent membrane layer 126, 128s have opposite orientations. In other embodiments, the upper membrane layer 126 can be oriented with the narrow opening portion at the top and the wide perimeter portion at the bottom and the lower membrane layer 128 can be oriented with the wide perimeter portion at the top and the narrow opening portion at the bottom.

In some embodiments, a plate 118 can couple adjacent membrane layers 126, 128 together. In particular, the plate 118 can be coupled to the narrow opening portions of the membrane layers 126, 128. With device 100, the conical membrane elements 106a and 106 are coupled to opposite side of the plate 118.

In the example of device 100 including a further membrane layer in the stack, an additional membrane layer can be adjacent to the upper membrane layer 126, or conical membrane element 106a with its wide perimeter portion oriented at the bottom and its narrow opening portion oriented at the top. In another example, an additional membrane layer can be adjacent to the lower membrane layer 128, or conical membrane element 106b with its wide perimeter portion oriented at the top and the narrow opening portion oriented at the bottom.

Although FIG. 1B show membrane layers 126, 128 having a round funnel-shape, other funnel-shapes are possible. For example, one or more of membrane elements 106 can have a square shape. Furthermore, FIG. 1A show membrane elements 106 in which the narrow opening portion is concentric with the wide perimeter portion. In other embodiments, the narrow opening portion may not be concentric with the wide perimeter portion. For example, the funnel-shape can be similar to an oblique cone-shape.

The membrane layers 126, 128, via conical membrane elements 106 are coupled to the connector rod 104. In particular, the connector rod 104 passes through the narrow opening portions of the membrane elements 106 and the membrane elements 106, at the narrow opening portions, are coupled to a first end portion of the connector rod 104. In some embodiments, where a plate 118 is provided between adjacent membrane elements 106, the connector rod 104 can pass through the plate 118. Thus, the plate 118 can be movable along the connector rod 104.

The connector rod 104 is rigid. The connector rod 104 has a longitudinal axis extending from the first end portion to a second end portion. As shown in FIGS. 1A and 1B, the first end portion is proximal to the support base 108 and the second end portion is proximal to the fastener 102. That is, the second end portion of the connector rod extends out from the first end of the stack. The membrane elements 106 are coupled to first end portion of the connector rod 104. The connector rod 104 can transfer motion from the second end portion to the first end portion, namely the membrane elements 106.

While the narrow opening portions of the membrane elements 106 are coupled to the connector rod 104, the wide perimeter portions of the membrane elements 106 are fixed in relation to the support base 108 that is proximal to the second end of the stack. In particular, the support base 108 can face the second end of the stack. As shown in FIGS. 1A and 1B, frames 114a, 114b (herein collectively referred to as frames 114) are coupled to the wide perimeter portions of the membrane elements 106 to maintain the position of the wide perimeter portions of the membrane elements 106 in relation to the support base 108. The device 100 further includes upwardly extending frame members (not shown in FIG. 1A) coupling frames 114. The upwardly extending frame members can maintain the relative position of the frames 114, that is, the spacing between frames 114.

As shown in FIG. 1A an 1B, support base 108 can include a plate 110 with holes 112a, 112b (herein collectively referred to as holes 112) therein for mounting the support base 108 to a surface. Plate 110 can have any appropriate shape. Although plate 110 is shown with two holes 112, plate 110 can include any number of holes.

A force can be applied to the connector rod 104 at the second end portion. A force along the longitudinal axis of the connector rod 104 can cause the connector rod to move. The connector rod 104 can transfer motion from the second end portion to the first end portion, namely the membrane elements 106. With the wide perimeter portions of the membrane elements 106 fixed in position in relation to the support base 108, movement of the connector rod 104 causes the membrane layers 126, 128, that is conical membrane elements 106 to stretch. For example, when a downward force is applied to the connector rod 104, membrane element 106a is stretched and membrane element 106b is compressed. When the downward force is subsequently removed from the connector rod 104, membrane element 106a and membrane element 106b are relaxed. When an upward force is applied to the connector rod 104, membrane element 106b is stretched and membrane element 106a is compressed.

The force applied to the connector rod 104 along the longitudinal axis of the connector rod 104 is linear in nature. That is, kinetic energy can be harvested from linear accelerations. Accordingly, the device 100 can be well suited for harvesting wave energy. In contrast to conventional wave harvesting systems, the device 100 does not incur energy losses in the conversion of linear to rotational acceleration.

The sequence or cycle of stretching and relaxing membrane element 106a results in membrane element 106a being charged and discharged. In the same stroke that membrane element 106a is stretched and relaxed, adjacent membrane element 106b can be compressed and relaxed. That is, adjacent membrane element 106b can be further discharge and then recharged. Furthermore, adjacent membrane element 106b can be stretched and then relaxed, resulting in further charge and discharge. Likewise, in the same stroke that adjacent membrane element 106b is stretched and relaxed, membrane element 106a can be compressed and relaxed. That is, membrane element 106a can be further discharged and then recharged. Utilization of the same stroke to both charge a membrane element and discharge another membrane element results in greater energy efficiency.

In some embodiments, the device 100 can further include an electrical energy storage component. The electrical energy storage component can receive at least a portion of the electrical charge accumulated by the first membrane layer 126 when force in the second direction is applied. Subsequently, the electrical energy storage component can receive at least a portion of the electrical charge accumulated by the second membrane layer 128 when force in the first direction is applied. In some embodiments, the electrical energy storage component can be one or more of a battery and a supercapacitor (i.e., an ultracapacitor).

As shown in FIGS. 1A and 1B, the fastener 102 can be a screw or bolt. Other fasteners are possible. The fastener 102 can be attached to the second end portion of the connector rod 104. In some embodiments, the fastener 102 can couple a physical load to the second end portion of the connector rod 104. The physical load can, in turn, apply a force to the connector rod 104. In some embodiments, the weight of the physical load can apply a force to the connector rod 104. Vertical movement of the physical load, which may, for example, be caused by vibration during transport of the physical load, can apply a force to the connector rod 104.

Figure 2A:
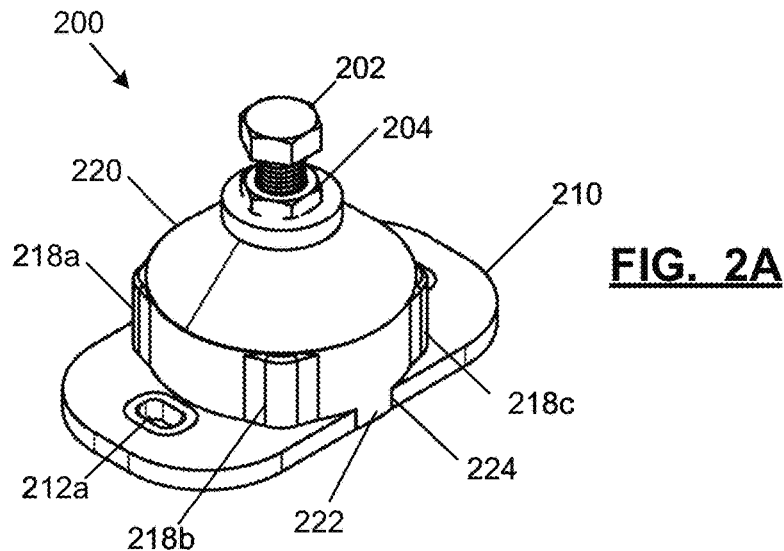
FIG. 2A is a perspective view of another kinetic energy harvesting device, in accordance with an example embodiment.
Figure 2B:
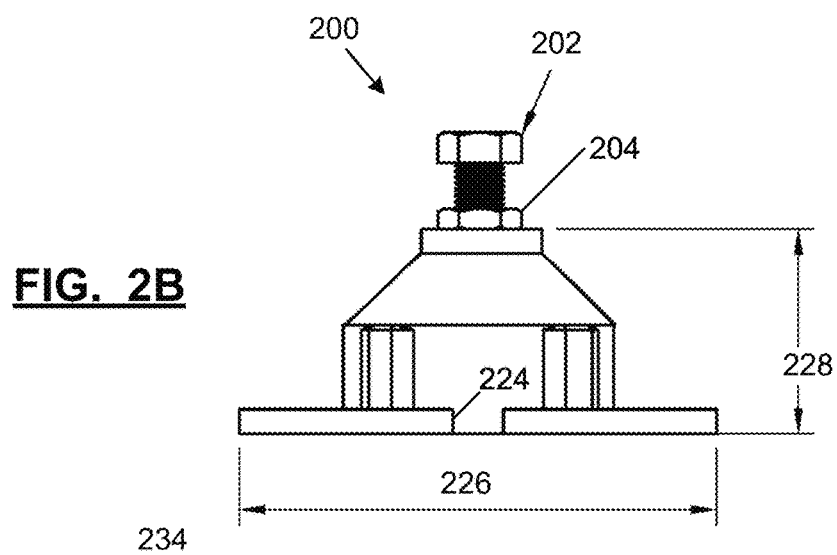
FIG. 2B is a front view of the device shown in FIG. 2A.
Figure 2C:
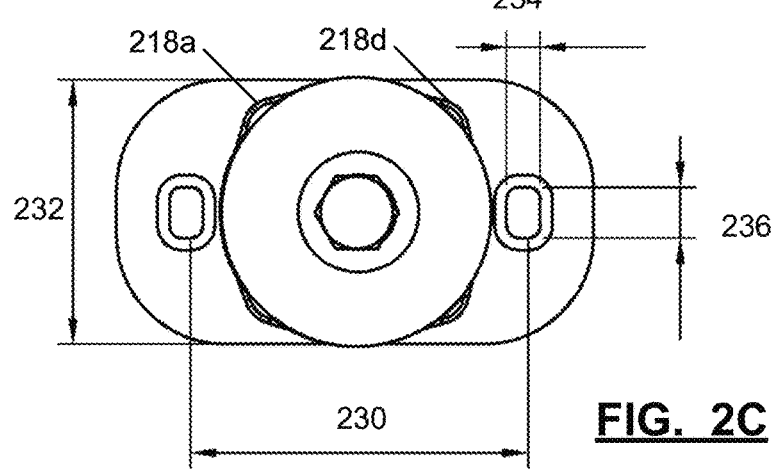
FIG. 2C is a top plan view of the device shown in FIG. 2A.

Reference now is made to FIG. 2A, FIG. 2B, and FIG. 2C, which illustrate a perspective view, a front view, and a top plan view of another kinetic energy harvesting device 200, in accordance with some embodiments. Similar to device 100, device 200 includes a fastener 202, a connector rod 204 (shown with a nut attached thereto), at least one membrane layer (not visible), and a support base (not visible). Each of the at least one membrane layer can include one or more membrane elements. Similar to the support base 108, the support base of device 200 also includes plate 210 defining holes 212a, 212b (herein collectively referred to as holes 212).

As shown in FIG. 2C, plate 210 generally has a rectangular shape of length 226 and width 232. In at least one embodiment, the plate has a length of about 10 cm. However, plate 210 can have any appropriate shape and size. A smaller footprint can be advantageous to allow the device 200 to be mounted to small surfaces, such as the hull of a marine vessel.

Holes 212 are shown as generally having a rectangular shape of length 236 and width 234. Furthermore, holes 212 are shown as being spaced apart 230. Although plate 210 is shown with two holes 212, plate 210 can include any number of holes, with any hole shape, and any appropriate spacing.

Device 200 also includes a cover portion 220. The cover portion 220 can define a hole for passage of the connector rod 204, namely the second end portion of the connector rod 204. The cover portion 220 can be fixed to the support base to enclose the plurality of membrane layers of device 200. The cover portion 220 can be rigid to prevent force from being applied to the wide perimeter portions of the membrane layers. As shown in FIG. 2B, the cover portion 220 has a height 228 that allows for upward stretching of an uppermost membrane layer.

In some embodiments, the cover portion 220 can include inner engaging surfaces having a shape complementary to a shape of the wide perimeter portions of the membrane layers. For example, cover portion 220 includes engagement portions 218a, 218b, 218c, and 218d (herein collectively referred to as engagement portions 218). The inner surface of the engagement portions 218 can be shaped to accommodate the shape of the frames 114, including the fasteners within the frames 114. In some embodiments, the cover portion 220 can prevent movement of the wide perimeter portions of the membrane layers. For example, the cover portion 220 can prevent rotation of the membrane layers around the connector rod 204. The cover portion 220 can also prevent vertical movement of the wide perimeter portions of the membrane layers.

As shown in FIGS. 2A and 2B, the cover portion 220 can have protrusions 222 that engage with a corresponding seat in surface 224 of plate 210 to prevent movement of the cover portion 220 in relation to the plate 210. Other embodiments are possible. For example, the cover portion 220 can define a seat while the cover portion 220 can define a protrusion.

Figure 3:
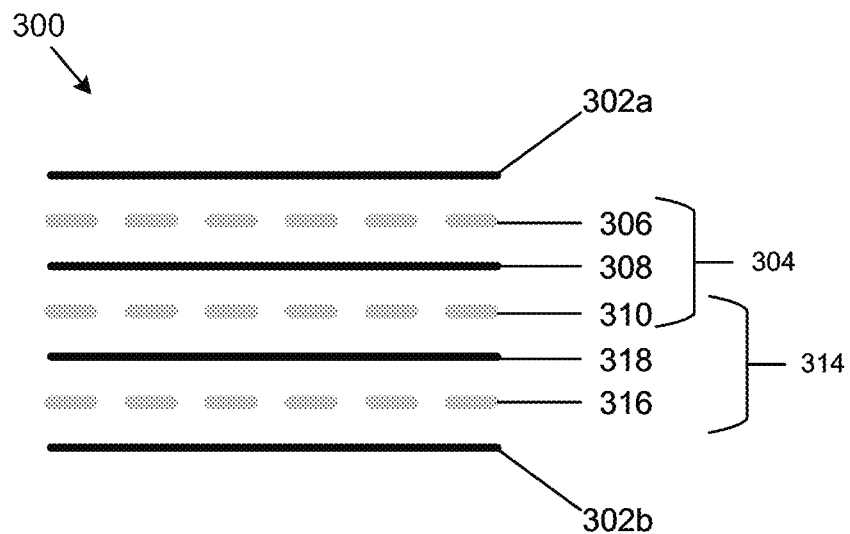
FIG. 3 is a schematic representation of a membrane element, in accordance with an example embodiment.

Reference is now made to FIG. 3, which is a schematic representation of a membrane element 300, in accordance with an example embodiment. Membrane element 300 can be any one of conical membrane elements 106a, 106 of device 100 or a membrane element of device 200. Membrane element 300 includes a pair of outer insulating elements 302a, 302b (herein collectively referred to as outer insulating elements 302), a pair of electrodes (herein collectively referred to as electrodes 306, 316) between the pair of outer insulating elements, a pair of dielectric elements 308, 318 between the pair of electrodes 306, 316, and a single electrode 310 between the pair of dielectric elements 308, 318.

In the configuration shown in FIG. 3, membrane element 300 can form two transducers 304, 314. First, transducer 304 is formed by electrode 306, dielectric element 308, and electrode 310. Second, transducer 314 is formed by electrode 316, dielectric element 318, and electrode 310. That is, transducers 304, 314 share a common electrode 310.

Although membrane element 300 is shown with two transducers, membrane element 300 can include additional transducers. Additional transducers can increase the maximum power output and the energy density of the device 100. For example, an additional dielectric element and an additional electrode can be positioned between electrode 306 and outer insulating element 302a. A third transducer is formed by electrode 306, the additional dielectric element and the additional electrode. Furthermore, a second additional dielectric element and electrode can be positioned between electrode 316 and outer insulating element 302b. A fourth transducer can be formed by electrode 316 and the second additional dielectric element and electrode.

Figure 4:
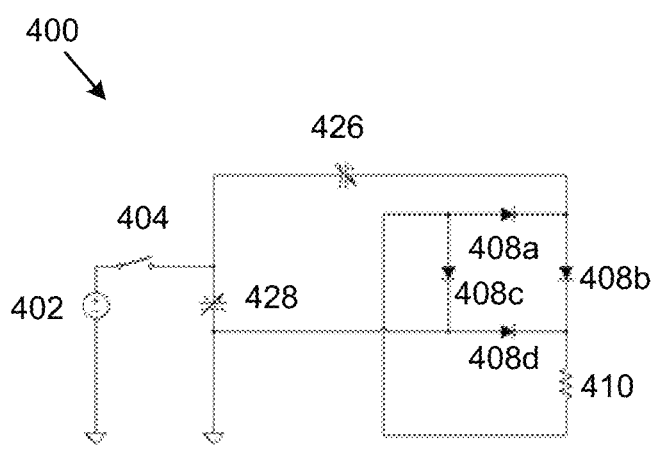
FIG. 4 is a schematic representation of an electrical circuit for a kinetic energy harvesting device, in accordance with an example embodiment.

Reference is now made to FIG. 4, which shows a schematic representation of an electrical circuit 400 for a kinetic energy harvesting device, in accordance with an example embodiment. Electrical circuit 400 can provide electrical power from a kinetic energy harvesting device, such as device 100 or device 200 having a plurality of membranes 106a, 106b, to a load 410.

Membrane layers 126, 128 of device 100 are represented in circuit 400 as elements 426, 428, respectively. As shown in FIG. 4, membrane layers 426, 428 (collectively referred to as membranes 426, 428) are connected in series. Electrical circuit 400 includes a voltage source 402, which can be used to charge the device 100, namely membrane layers 426, 428. Electrical circuit 400 also includes a switch 404 for controlling the charge from voltage source 402 to the device 100.

Electrical circuit 400 also includes a diode bridge formed by a plurality of diodes 408a, 408b, 408c, and 408d. The diode bridge for providing the same polarity of output (i.e., at load 410) whether the charge is from either membrane layer 426 or membrane layer 428.

In some embodiments, the device 100 can include a capacitor. For example, the device 100 can include a capacitor further in parallel with the membrane layers 426, 428. In another example, device 100 can include a capacitor instead of dielectric membrane element 106b. However, a dielectric membrane element 106b can generally have a greater charge capacity than an equivalent sized capacitor. As described earlier, additional membrane elements and membrane layers can increase the energy density of the device 100.

In at least one embodiment, device 100 with two membranes elements 106a, 106b can have a capacity of approximately 10 Watts (W). With a footprint of approximately 10 cm, the energy density of device 100 can be approximately 100 times the energy density of conventional electromagnetic energy harvesting systems.

Reference now is made to FIG. 5A to FIG. 5D, which illustrate a side view, a top plan view, and perspective views of a kinetic energy harvesting device 500, in accordance with some embodiments. Similar to device 100, the device 500 includes a connector rod 504 and a plurality of membrane layers 526, 528.

As shown in FIG. 5A to FIG. 5D, each membrane layer 526, 528 of device 500 includes at least one elongated membrane element. In particular, membrane layer 526 includes four elongated membrane elements 506a, 506b, 506c, and 506d (herein collectively referred to as elongated membrane elements 506) and membrane layer 528 includes four elongated membrane elements 508a, 508b, 508c, and 508d (herein collectively referred to as elongated membrane elements 508). In other embodiments, one or more membrane layers 526, 528 can have additional membrane elements 506, 508. Membrane layers 526, 528 can have a different number of membrane elements 506, 508. Additional membrane elements 506, 508 for each membrane layer 526, 528 can increase the maximum power output and the energy density of the device 500.

Although FIG. 5A to 5D show membrane layers 526, 528 having gaps, or space between the elongated membrane elements at the wide perimeter portions of the membrane layers 526, 528, in other embodiments, such gaps can vary. For example, fewer or more elongated membrane elements can be provided so that the gaps can be narrower or wider.

For each membrane layer 526, 528, elongated membrane elements 506, 508 can extend between the narrow opening portion of that membrane layer to the wide perimeter portion of that membrane layer. As shown in FIG. 5A to 5D, device 500 can include a plate 518 at the narrow opening portion the membrane layers 526, 528. A first end of each of the elongated membrane elements 506 of the upper membrane layer 526 are coupled to a first side of plate 518. A first end of each of the elongated membrane elements 508 of the lower membrane layer 528 are coupled to a second side of the plate 518. Thus, the plate 518 couples adjacent membrane layers 526, 528 together.

As shown in FIG. 5A to 5D, a second end of each of the elongated membrane elements 506 of the upper membrane layer 526 are coupled to frame 514a. A second end of each of the elongated membrane elements 508 of the lower membrane layer 528 are coupled to frame 514b. Thus, the wide perimeter portions of the membrane layers 526, 528 are coupled to frames 514a, 514b (herein collectively referred to as frames 514).

Figure 5A:
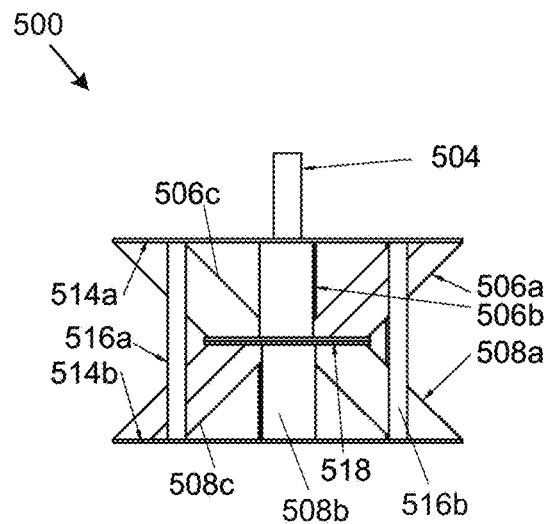
FIG. 5A is a side view of another kinetic energy harvesting device, in accordance with an example embodiment.
Figure 5B:
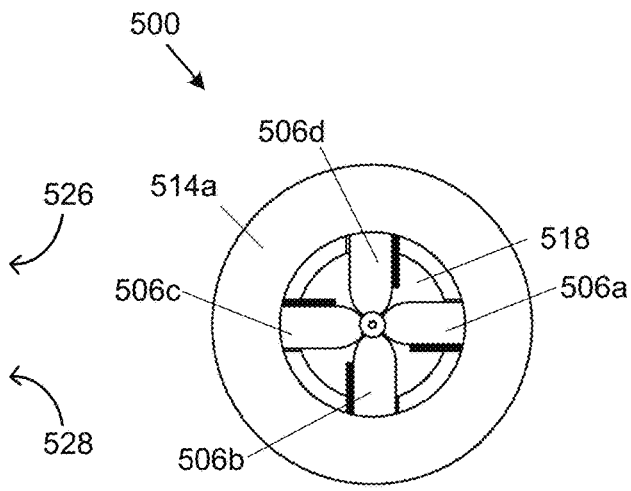
FIG. 5B is a top plan view of the kinetic energy harvesting device of FIG. 5A.
Figure 5C:
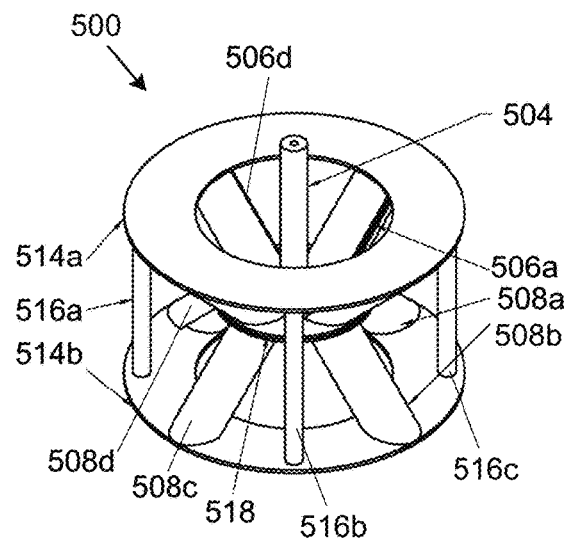
FIG. 5C is a perspective view of the kinetic energy harvesting device of FIG. 5A.
Figure 5D:
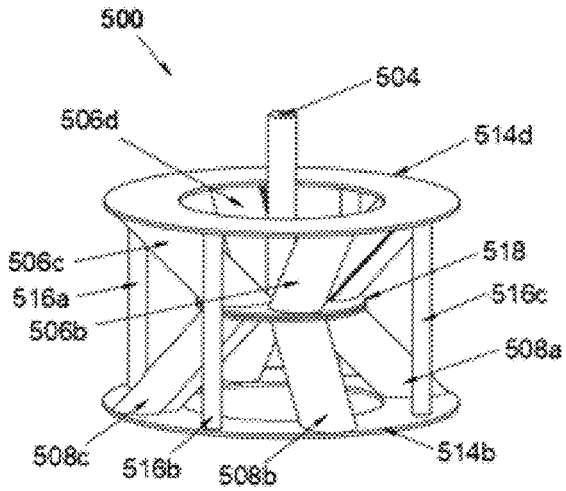
FIG. 5D is another perspective view of the kinetic energy harvesting device of FIG. 5A.

As shown in FIG. 5D, device 500 further includes upwardly extending frame members 516a, 516b, 516c, 516d (herein collectively referred to as frame members 516). Frame members 516 are coupled to frames 514. Frame members 516 are rigid to maintain the relative position of the frames 514, that is, the spacing between frames 514. When the device 500 is mounted to a support base, such as support base 108, frame members 516 maintain the position of the wide perimeter portion of the membrane layers 526, 528 in relation to the support base.

Reference is now made to FIG. 6A to FIG. 6D, which illustrate perspective views and a top plan view of a membrane element 600, in accordance with an example embodiment. Membrane element 600 can be any one of elongated membrane elements 506, 508 of device 500.

Figure 6A:
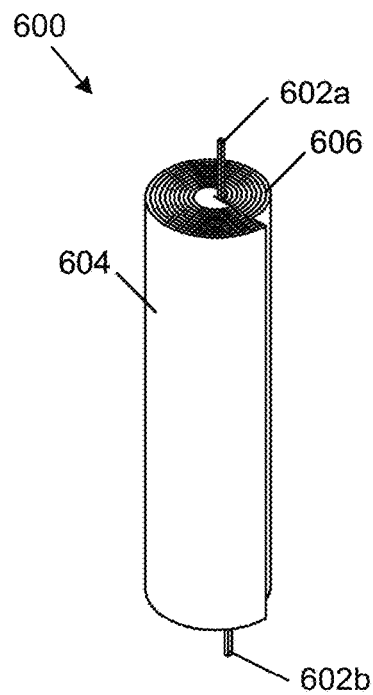
FIG. 6A is a perspective view of another membrane element, in accordance with an example embodiment.
Figure 6C:
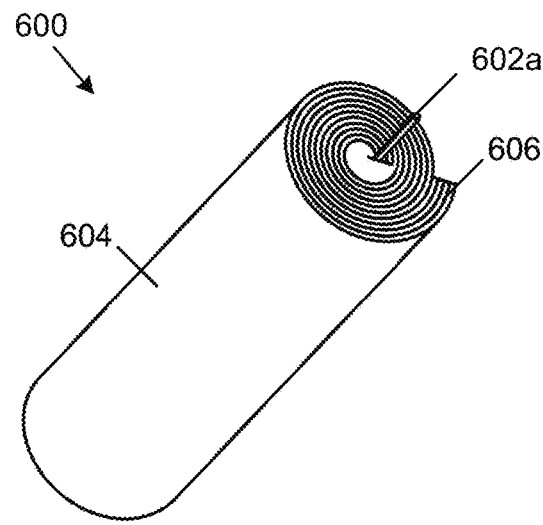
FIG. 6C is another perspective view of the membrane element of FIG. 6A.
Figure 6B:
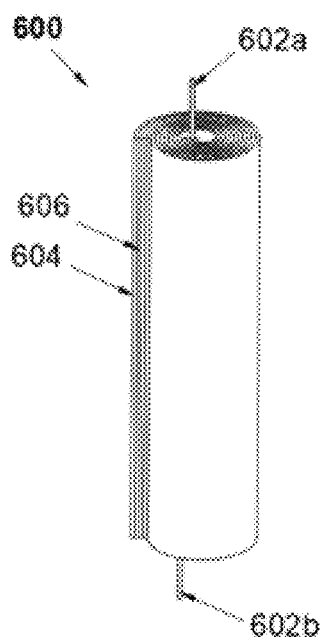
FIG. 6B is another perspective view of the membrane element of FIG. 6A.
Figure 6D:
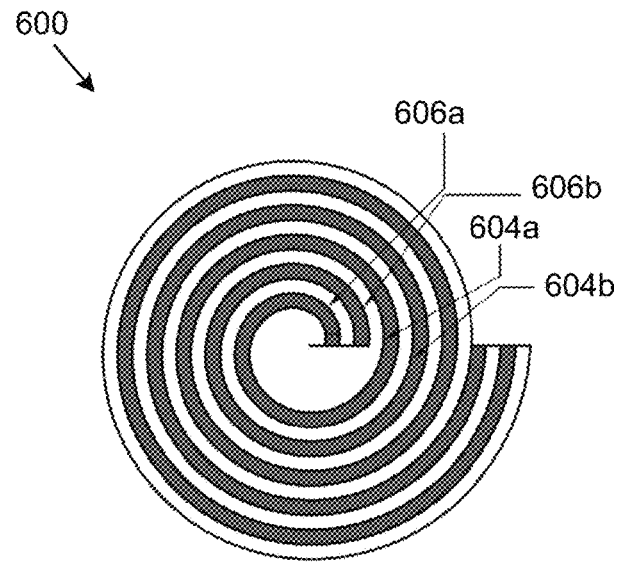
FIG. 6D is a top plan view of the membrane element of FIG. 6A.

As shown in FIG. 6A to FIG. 6C, membrane element 600 can be a rolled stack. In some embodiments, the rolled stack can be rolled around a supporting rod. In the example shown in FIG. 6D, the rolled stack can include a first dielectric element 604a, a first electrode 606a adjacent the first dielectric element 604a, a second dielectric element 604b adjacent the first electrode 606a, and a second electrode 606b adjacent the second dielectric element 604b. Lead lines 602a, 602b (herein referred to as lead lines 602) can extend from each electrode 606, respectively. In other embodiments, fewer or more dielectric elements 604 and electrodes 606 can be included. The rolled stack can include at least two electrodes 606 and at least one dielectric element 604 between the two electrodes 606.

Figure 8A:
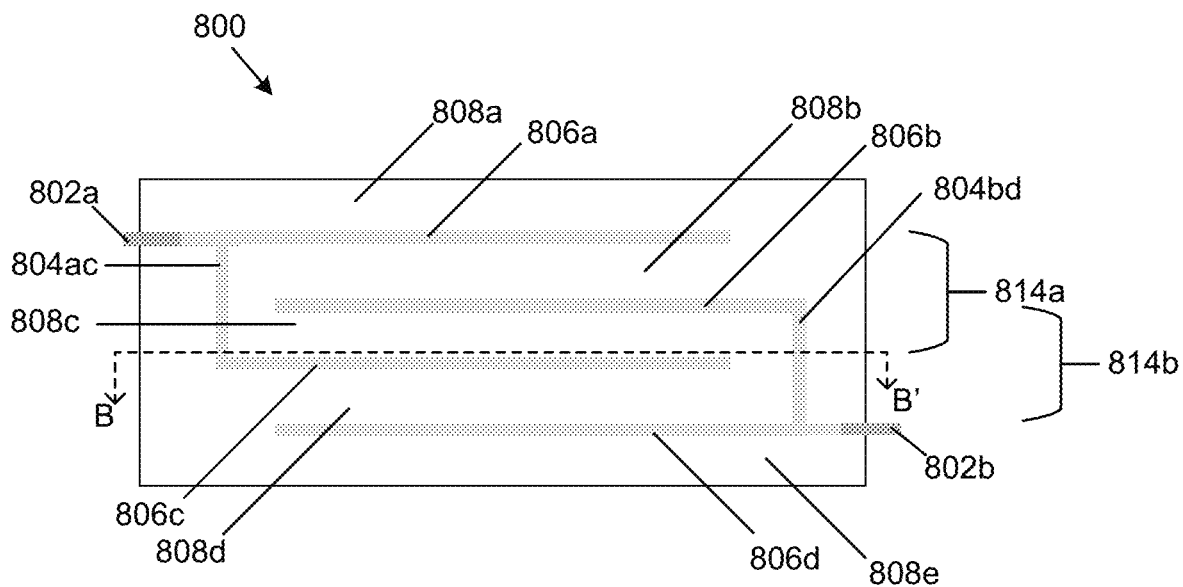
FIG. 8A is a schematic representation of a cross-section of a membrane element, in accordance with an example embodiment.
Figure 8B:
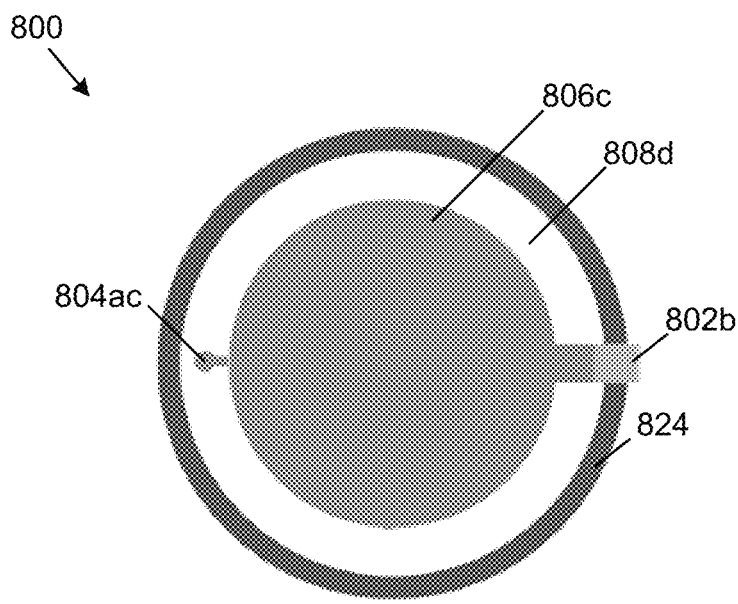
FIG. 8B is a schematic representation of a top plan view of a portion of the membrane element of FIG. 8A, in accordance with an example embodiment.
Figure 9:
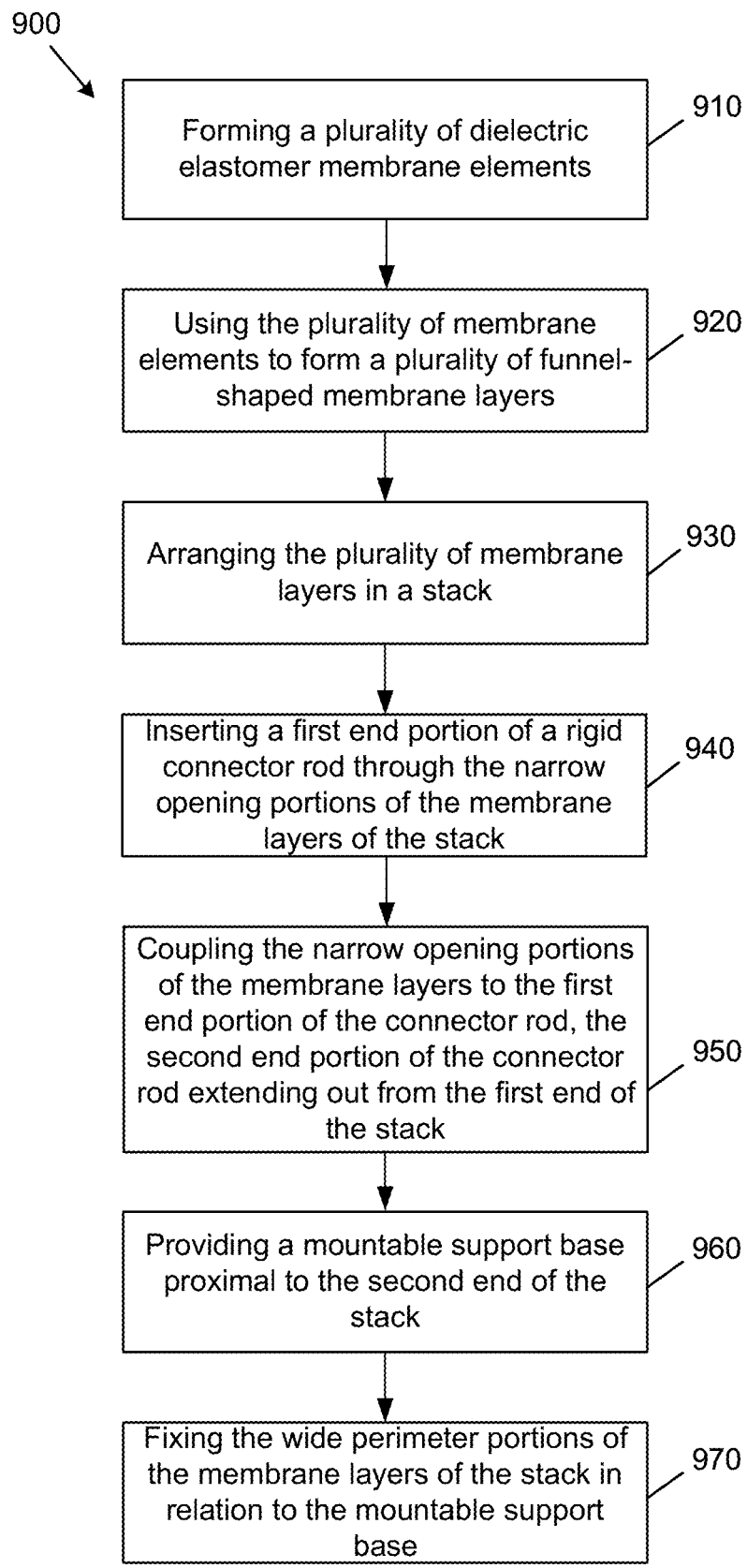
FIG. 9 is a flowchart of a method for manufacturing a kinetic energy harvesting device, in accordance with an example embodiment.

Reference now is made to FIG. 9, which illustrates a flowchart for a method 900 for manufacturing a kinetic energy harvesting device, in accordance with some embodiments. To assist with the description of the method 900 shown in FIG. 9, reference will be made simultaneously to FIGS. 1A, 1B, 3, 5A, 6D, 7A, 7B, 8A, and 8B.

Method 900 can begin at 910, when a plurality of dielectric elastomer membrane elements 106, 306, 600 are formed. The dielectric elastomer membrane elements 106, 300, 600 can be configured to accumulate electrical charge when cyclically stretched and relaxed.

In some embodiments, each dielectric elastomer membrane element of the plurality of dielectric elastomer membrane elements 106, 300, 600 can be formed successively stacking electrodes on dielectric elements and vice versa. For example, a dielectric elastomer membrane element 106, 300, 600 can be formed by providing a first dielectric element 308, 604b and forming an electrode 306, 310, 606 on each side of the first dielectric element. Each electrode 306, 310, 606 can be formed by applying a layer of liquid metal to the first dielectric element 308, 604b. In some embodiments, additional alternating layers of dielectric elements 318, 604a and electrodes 316 can be provided. In some embodiments, one or more dielectric elements 308, 318, 604 can be a pre-cured dielectric film. For example, the first dielectric element 308, 604a, can be a pre-cured dielectric film. As previously noted, the dielectric film can be a silicone or a natural rubber latex. The pre-cured dielectric film can be covered with an adhesive. The pre-cured dielectric film can have any appropriate shape. For example, the pre-cured dielectric film can be a circular sheet or a rectangular sheet.

In some embodiments, one or more dielectric elements 308, 318, 604 may not be pre-cured. Instead, a dielectric element 308, 318, 604 can be formed by applying a liquid elastomer to an electrode 306, 310, 606 and curing and/or vulcanizing the liquid elastomer to form the dielectric element 308, 318, 604. For example, the liquid elastomer can be liquid silicone or liquid natural rubber latex. Furthermore, a mold can be used to form the dielectric element 308, 318, 604. That is, the liquid elastomer can be poured into the mold.

In some embodiments, liquid metal can be applied to a surface of a dielectric element 308, 318, 604 and spread across the surface of the dielectric element 308, 318, 604 to form a thin film of liquid metal. The liquid metal can be spread across the surface of the dielectric element 308, 318, 604 by doctor blading or painting. For example, the liquid metal can be painted using a brush, roll, or spray. In some embodiments, the liquid metal can be spread out to have a thickness of a few micrometers. Spreading the liquid metal can help mitigate pooling of the liquid metal and thus, form an electrode having a more uniform thickness.

Any appropriate liquid metal that is conductive and remains conductive through stretching and relaxing cycles can be used to form the electrode. Example metals include gallium alloys, gallium-indium alloys, mercury, gallium-indium-tin alloys, and/or eutectic gallium alloys. In some embodiments, the liquid metal can have a melting point that is less than 50 degrees Celsius.

In some embodiments, a stencil can be used when forming the electrode 306, 310, 606. The stencil can define holes therein. The stencil 700 can help the liquid metal stay in place as the liquid metal is spread out. In some embodiments, stencils can be used to form patterned electrodes. Patterned electrodes can allow for better adhesion between layers of dielectric element 308, 318, 604. A stencil can be placed on top of the dielectric element 308, 318, 604. Liquid metal can be applied to surfaces of the dielectric element 308, 318, 604 exposed by holes of the stencil. The stencil can subsequently be removed.

Figure 7A:
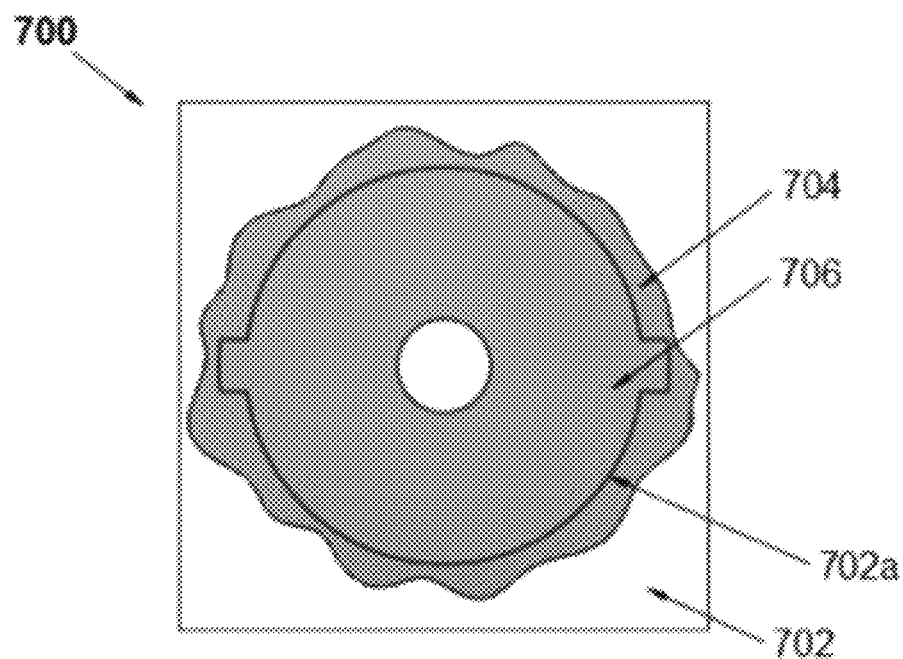
FIG. 7A is a top plan view of a stencil, in accordance with an example embodiment.
Figure 7B:
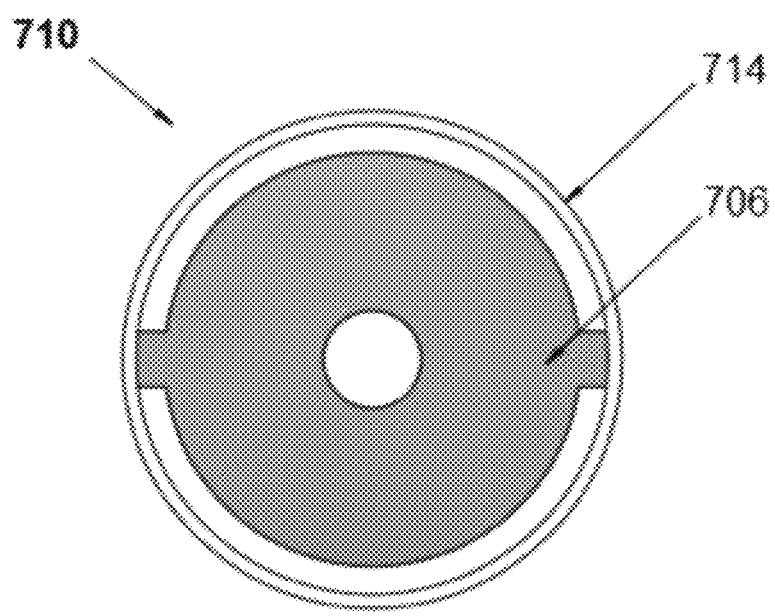
FIG. 7B is a top plan view of an electrode, in accordance with an example embodiment.

Reference now is made to FIGS. 7A and 7B, which illustrate top plan views 700 and 710 of a stencil and an electrode, in accordance with some embodiments. As shown in FIG. 7A, the stencil 702 has cutouts or holes 702a therein. The stencil 702 can be placed on a dielectric element. Liquid metal 704 can be spread across the surface of the dielectric element exposed by the holes 702a of the stencil 700 to form the electrode 706. FIG. 7B shows the electrode 706 that remains after the stencil 702 is removed. As can be seen in FIG. 7B, the membrane element, of which electrode 706 is a part of, is coupled to a frame 714 to maintain the position of the wide perimeter portion of the membrane element in relation to a support base.

As previously noted, in some embodiments, a membrane element can include any appropriate number of alternating layers of dielectric elements 308, 318, 604 and electrodes 306, 310, 316, 606. In some embodiments, the dielectric elements 308, 318, 604 can define channels therein. The channels can provide an electrical connection between two electrodes on opposite sides of a dielectric element.

Reference is now made to FIG. 8A, which is a schematic representation of a cross-section of a membrane element 800, in accordance with an example embodiment. Membrane element 800 can be any one of membrane elements 106, 506, 508, 600. Membrane element 600 includes a plurality of dielectric elements 808a, 808b, 808c, 808d, 808e (herein collectively referred to as dielectric elements 808) and a plurality of electrodes 806a, 806b, 806c, 806d (herein collectively referred to as electrodes 806). In particular, a pair of outer dielectric elements 808a, 808e, a pair of outer electrodes 806a, 806d between the pair of outer dielectric elements 808a, 808e, a pair of inner dielectric elements 808b, 808d between the pair of outer electrodes 806a, 806d, a pair of inner electrodes 806b, 806c between the pair of inner dielectric elements 808b, 808d, and a single dielectric element 808c between the pair of inner electrodes 806b, 806d. One or more of electrodes 806 can be similar to electrode 706 of FIGS. 7A and 7B.

In some embodiments, the outer dielectric elements can be insulating elements, similar to 302a, 302b. Membrane element 800 also includes lead lines 802a, 802b, which are similar to lead lines 602. In the configuration shown in FIG. 8A, membrane element 800 can form two transducers 814a, 814b (herein collectively referred to as electrodes 814). First, transducer 814a is formed by electrode 806a, dielectric element 808b, electrode 806b, dielectric element 808c, and electrode 806c. Second, transducer 814b is formed by electrode 806b, dielectric element 808c, electrode 806c, dielectric element 808d, and electrode 806d. The transducers 814 share a common dielectric element 808c and electrodes 806b, 806c.

As shown in FIG. 8A, the dielectric elements 808b, 808c define a channel 804ac. Channel 804ac allows for a connection of electrodes 806a and 806c. Similarly, dielectric elements 808c, 808d define a channel 804bd, which allows for a connection of electrodes 806b and 806d. A conductive element, such as copper, can be provided in channels 804ac, 804bd (herein collectively referred to as channels 804) to provide an electrical connection between the corresponding electrodes 806. In particular, channel 804ac within dielectric elements 808b and 808c allows for an electrical connection of electrode 806a, which is on one side of dielectric elements 808b and 808c, and electrode 806c, which is on the opposite side of dielectric elements 808b and 808c. Similarly, channel 804bd within dielectric elements 808c and 808d allows for an electrical connection of electrode 806b, which is on one side of dielectric elements 808c and 808d, and electrode 806d, which is on the opposite side of dielectric elements 808c and 808d.

Any appropriate conductive metal can be used as the conductive element inserted within the channels 804. The conductive element can be solid at room temperature. Furthermore, the conductive element can be soldered to interface with the corresponding electrodes 806.

In some embodiments, the channels 804 can be spaced apart from the electrodes 806 to reduce unintentional contact between channels 804 and electrodes 806. As shown in FIG. 8A, the channel 804ac is separated from electrode 806b by dielectric material connecting dielectric 808b and 808c. Similarly, channel 804bd is separated from electrode 806c by dielectric material connecting dielectric 808c and 808d.

In some embodiments, the dielectric elements 808b, 808c can be stamped or cut to form the channels 804 therein. Cutting can be performed using a knife or a laser. When the dielectric element 808b, 808c is formed by pouring a liquid elastomer into a mold, the mold can include projections that define holes within the dielectric element 808b, 808c once the liquid elastomer is cured.

Reference is now made to FIG. 8B, which is a schematic representation of a top plan view of a portion of the membrane element 800 of FIG. 8A, in accordance with an example embodiment. In particular, FIG. 8B is a top plan view taken at the cutaway B-B' of FIG. 8A. As shown in FIG. 8B, electrode 806c can have a circular shape. Electrode 806c does not cover the entire surface area of dielectric element 808d. Dielectric element 808d includes a channel 804ac to allow for connection of underlying electrode 806d (not visible in FIG. 8B) to an electrode to be formed on top of dielectric element 808d, such as electrode 806b. As can be seen in FIG. 8B, lead line 802b extends out from the membrane element 800. It should be noted that lead line 802 and channel 804ac shown in FIG. 8B for illustrative purposes but can extend from any point along the perimeter of the electrode 806c.

Returning now to FIG. 9, at 920, the plurality of membrane elements are used to form a plurality of funnel-shaped membrane layers, such as membrane layers 126, 128, 526, 528. Each membrane layer can be funnel-shaped with a narrow opening portion and a wide perimeter portion.

As described above, dielectric elastomer membrane elements can be a conical membrane element, such as membrane elements 106. The conical membrane element can be formed using a thin, circular membrane element, such as membrane element 800 shown in FIG. 8B. A hole can be made within the circular membrane element 800 to define the narrow opening portion. Similar to the channels, the circular membrane element 800 can be stamped or cut to form the narrow opening portion. The wide perimeter portion of the circular membrane element 800 can be coupled to frame 824. The wide perimeter portion and the narrow opening portions of the circular membrane element 800 can be pulled in opposite directions to form the conical membrane element 106.

As described above, dielectric elastomer membrane elements can be elongated membrane elements that are arranged to extend between the narrow opening portion of a membrane layer to the wide perimeter portion of the membrane layer, such as membrane elements 506, 508, 600. Elongated membrane elements 506, 508, 600 can be formed by rolling a membrane element into a rolled stack. For example, a thin, rectangular membrane element 600 can be rolled into a rolled stack, such as that shown in FIG. 6A to 6C.

At 930, the plurality of membrane layers 126, 128, 526, 528 are arranged in a stack. Each membrane layer 126, 526 can be adjacent to another membrane layer 128, 528 having an opposite orientation defined by the narrow opening and the wide perimeter portion.

At 940, a first end portion of a rigid connector rod, such as connector rod 104, 504 are inserted through the narrow opening portions of the membrane layers of the stack. The connector rod 104, 504 can having a longitudinal axis extending from the first end portion to a second end portion.

At 950, the narrow opening portions of the membrane layers 126, 128, 526, 528 of the stack are coupled to the first end portion of the connector rod 104, 504. The second end portion of the connector rod 104, 504 can extend out from the first end of the stack.

At 960, a mountable support base, such as support base 108, is provided proximal to the second end of the stack.

At 970, the wide perimeter portions of the membrane layers 126, 128, 526, 528 of the stack are fixed in relation to the mountable support base 108. This allows the application of linear force at the second end portion of the connector rod 104, 504 in a first direction along the longitudinal axis to cause at least a first membrane layer 126, 526 of the plurality of membrane layers to stretch and application of the force in a second direction opposite to the first direction causes at least a second membrane layer 128, 528 adjacent to the first membrane layer 126, 526 to stretch.

Figure 10:
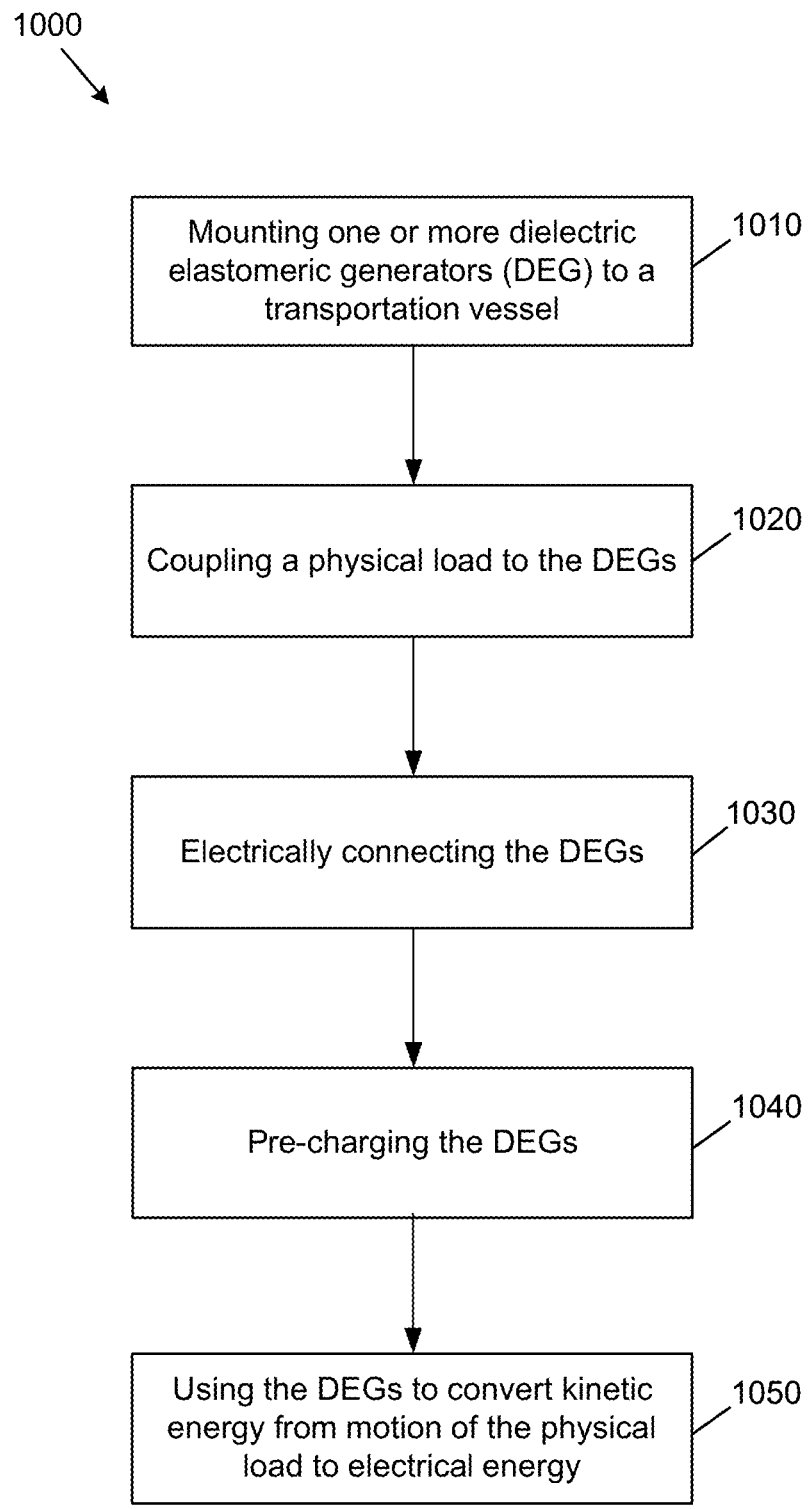
FIG. 10 is a flowchart of a method for harvesting kinetic energy, in accordance with an example embodiment.

Reference now is made to FIG. 10, which illustrates a flowchart for a method 1000 for harvesting kinetic energy, in accordance with some embodiments. To assist with the description of the method 1000 shown in FIG. 10, reference will be made simultaneously to FIGS. 1A, 1B, and 5A.

Method 1000 can begin at 1010, when one or more devices for harvesting kinetic energy, such as device 100, device 200, or device 500, are mounted to a transportation vessel. As previously described, each device 100 can include a plurality of membrane layers connected to a first end portion of a connector rod 104. The connector rod 104 has a longitudinal axis extending from the first end portion to a second end portion.

At 1020, a physical load is coupled to the second end portion of connector rods 104 of the one or more devices 100. In some embodiments, the physical load can be coupled to connector rods 104 with a fastener, such as fastener 102. Furthermore, the physical load can be suspended between devices 100. For example, a physical load can be suspended between two devices 100. Suspending physical loads between a plurality of devices 100 can be reduce the vibrations and shock applied to the physical load. Reducing the vibrations and shock can be particularly advantageous when the physical load is a sensitive load, such as but not limited to equipment that has low seismic robustness. For example, the load can be electronics that are sensitive to vibration and shock.

At 1030, the one or more devices 100 are electrically connected. For example, adjacent membrane layers of a device 100, via membrane elements 106 can be connected in series as shown in circuit 400. In some embodiments, a plurality of devices 100 can be used together in a parallel connection to increase the total power capacity.

At 1040, the devices 100 are pre-charged. An initial charge can be applied to the devices 100 via voltage source 402 and switch 404.

At 1050, kinetic energy from motion of the physical load is converted to electrical energy. The motion of the physical load applies a linear force to the connector rod in a first direction along the longitudinal axis followed by another linear force to the connector rod in a second direction opposite to the first direction. The linear force in the first direction causes at least a first membrane to stretch. The linear force in the second direction causes at least a second membrane adjacent to the first membrane layer to stretch.

In some embodiments, the method can further involve using the electrical energy to power an electrical load, such as load 410. In other embodiments, the method can further involve storing the electrical energy in an electrical energy storage component, such as but not limited to a battery or a supercapacitor. Electrical energy can be subsequently drawn from the electrical energy storage for use.

In some embodiments, the transportation vessel can be a marine vessel. The devices 100 can be mounted to a hull of the marine vessel or buoys. The motion of the physical load can be caused by tidal forces acting on the marine vessel. Tidal forces acting on the marine vessel are generally continuous. As such, the device 100 can provide a continuous power supply and reduce the need for large energy storage components (i.e., batteries) and reduce the use of fossil fuels. Furthermore, the device 100 can provide vibration-damping for the physical load.

In other embodiments, the transportation vessel can be a land-based vessel. In yet other embodiments, the device 100 may not be mounted to transportation vessels. The device 100 can be suitable for other applications as well. The device 100 can also be used in various applications that require small, lightweight, on-board energy supply. For example, the device 100 can be used in wearable devices or medical devices and harvest kinetic energy from movement of the human body.

In another example, the device 100 can be mounted to rotor blades of a turbine. Although the device 100 harvests energy from linear accelerations, it can also be used for harvesting kinetic energy from the up and down (i.e., vertical) motion of a rotating turbine.

It will be appreciated that numerous specific details are set forth in order to provide a thorough understanding of the example embodiments described herein. However, it will be understood by those of ordinary skill in the art that the embodiments described herein may be practiced without these specific details. In other instances, well-known methods, procedures, and components have not been described in detail so as not to obscure the embodiments described herein. Furthermore, this description and the drawings are not to be considered as limiting the scope of the embodiments described herein in any way, but rather as merely describing the implementation of the various embodiments described herein.

It should be noted that terms of degree such as "substantially", "about" and "approximately" when used herein mean a reasonable amount of deviation of the modified term such that the end result is not significantly changed. These terms of degree should be construed as including a deviation of the modified term if this deviation would not negate the meaning of the term it modifies.

In addition, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should be noted that the term "coupled" used herein indicates that two elements can be directly coupled to one another or coupled to one another through one or more intermediate elements.

Various embodiments have been described herein by way of example only. Various modification and variations may be made to these example embodiments without departing from the spirit and scope of the invention, which is limited only by the appended claims.

The invention claimed is:

1. A kinetic energy harvesting device, the device comprising:
a plurality of dielectric elastomer membrane layers arranged in a stack having a first end and a second end, each membrane layer being funnel-shaped with a narrow opening portion and a wide perimeter portion, each membrane layer being adjacent to another membrane layer having an opposite orientation defined by the narrow opening portion and the wide perimeter portion, each membrane layer being configured to accumulate electrical charge when cyclically stretched and relaxed, and each membrane layer having at least one conical membrane element, each conical membrane element having a pair of outer insulating elements, a pair of electrodes between the pair of outer insulating elements, and a dielectric element between the pair of electrodes;
a rigid connector rod having a longitudinal axis and extending from a first end portion to a second end portion, the narrow opening portions of the membrane layers being coupled to the first end portion of the connector rod, the second end portion of the connector rod extending out from the first end of the stack; and
a mountable support base facing the second end of the stack, the wide perimeter portions of the membrane layers being fixed in relation to the support base;
so that application of linear force at the second end portion of the connector rod in a first direction along the longitudinal axis causes at least a first membrane layer to stretch and application of the force in a second direction opposite to the first direction causes at least a second membrane layer adjacent to the first membrane layer to stretch.

2. The device of claim 1, wherein each membrane layer comprises a plurality of elongated membrane elements, each elongated membrane element of the plurality of elongated membrane elements extending between the narrow opening portion of that membrane layer and the wide perimeter portion of that membrane layer.

3. The device of claim 2, wherein each elongated membrane element comprises a rolled stack, the rolled stack comprising at least two electrodes and a dielectric element between the two electrodes.

4. The device of claim 3, wherein the rolled stack comprises a first dielectric element, a first electrode adjacent the first dielectric element, a second dielectric element adjacent the first electrode, and a second electrode adjacent the second dielectric element.

5. The device of claim 1, wherein the at least one conical membrane element consists of the pair of outer insulating elements, a pair of electrodes between the pair of outer insulating elements, the pair of dielectric elements between the pair of electrodes, and a single electrode between the pair of dielectric elements, wherein a first dielectric transducer is formed by a first electrode of the pair of electrodes, a first dielectric element of the pair of the dielectric elements, and the single electrode, and a second dielectric transducer is formed by a second electrode of the pair of electrodes, a second dielectric element of the pair of the dielectric elements, and the single electrode.

6. The device of claim 1 further comprising an electrical energy storage component, the electrical energy storage component receiving at least a portion of the electrical charge accumulated by the first membrane layer when force in the second direction is applied and at least a portion of the electrical charge accumulated by the second membrane layer when force in the first direction is applied.

7. The device of claim 1 further comprising a fastener attachable to the second end portion of the connector rod for coupling the second end portion to a physical load.

8. The device of claim 1, wherein the first end portion of the connector rod passes through the narrow opening portion of each membrane layer of the plurality of membrane layers.

9. The device of claim 1, wherein the plurality of membrane layers comprises an upper-most membrane layer and a lower-most membrane layer, the connector rod extending out from the upper-most membrane layer, the mountable support base facing the lower-most membrane layer.

10. The device of claim 1 further comprising a rigid frame for maintaining the wide perimeter portions of the membrane layers in fixed relation to the support base.

11. The device of claim 1 further comprising one or more plates connecting adjacent membrane layers of the plurality of membrane layers.

12. The device of claim 11 wherein the one or more plates connect the narrow opening portions of adjacent membrane layers of the plurality of membrane layers.

13. The device of claim 1 further comprising a cover portion for enclosing the plurality of membrane layers, the cover portion having a hole there through for passage of the second end portion of the connector rod, the cover portion being fixable to the mountable support base.

14. The device of claim 13, wherein the cover portion comprises inner engaging surfaces having a shape complementary to a shape of surfaces of the wide perimeter portions of the membrane layers.

15. The device of claim 1, wherein each membrane layer comprises a single conical membrane element.

16. The device of claim 3, wherein each of the electrodes are stretchable.

17. The device of claim 9, wherein the upper-most membrane layer is oriented with the wide perimeter portion upwards.

18. The device of claim 9, wherein the upper-most membrane layer is oriented with the wide perimeter portion downwards.

\* \* \* \* \*